(12) United States Patent
Chiba

(10) Patent No.: US 6,194,312 B1
(45) Date of Patent: Feb. 27, 2001

(54) SEMICONDUCTOR DEVICE AND METHOD OF MANUFACTURING THE SAME

(75) Inventor: Kazuhiro Chiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/112,378

(22) Filed: Jul. 9, 1998

(30) Foreign Application Priority Data

Jul. 10, 1997 (JP) .................................................. 9-185197

(51) Int. Cl.⁷ ................................................ H01L 21/308
(52) U.S. Cl. .......................... 438/669; 438/734; 438/73; 430/312
(58) Field of Search .......................... 430/312; 438/669, 438/73, 734, FOR 125

(56) References Cited

U.S. PATENT DOCUMENTS 5,670,427 * 9/1997 Cho .

FOREIGN PATENT DOCUMENTS

| 53-97775 | 8/1978 | (JP) . |
|---|---|---|
| 55-27657 | 2/1980 | (JP) . |
| 63-17528 | 1/1988 | (JP) . |
| 63-47924 | 2/1988 | (JP) . |
| 64-55826 | 3/1989 | (JP) . |
| 3-180041 | 8/1991 | (JP) . |
| 3-180067 | 8/1991 | (JP) . |
| 4-96279 | 3/1992 | (JP) . |
| 4-133363 | 5/1992 | (JP) . |
| 4-302425 | 10/1992 | (JP) . |
| 5-226668 | 9/1993 | (JP) . |
| 6-43017 | 2/1994 | (JP) . |
| 8-105794 | 4/1996 | (JP) . |

OTHER PUBLICATIONS

Silicon Processing for the VLSI Era vol. 2 Process Integration, Stanley Wolf, Lattice Press, Sunset Beach, California, p. 271, Jun. 1990.*

Microscopic Uniformity in Plasma Etching, Richard A. Gottscho and C.W. Jurgensen, Jun. 1992.*

* cited by examiner

Primary Examiner—George Fourson
Assistant Examiner—Barbara Elizabeth Abbott
(74) Attorney, Agent, or Firm—Sughrue, Mion, Zinn, Macpeak & Seas, PLLC

(57) ABSTRACT

In a semiconductor device manufacturing method includes the steps of uniformly applying a first photoresist onto a first layer on a semiconductor substrate, a first resist pattern is formed out of the first photoresist by using a first photomask. The first layer is etched by using the resist pattern, thereby forming a first pattern. A second photoresist is uniformly applied onto the semiconductor substrate where the first pattern is formed. A second resist pattern is formed out of the second photoresist by using a second photomask. The first pattern is etched by using the second photoresist, thereby forming a second pattern constituted by the first layer. A semiconductor device fabricated by this method is also disclosed.

9 Claims, 8 Drawing Sheets

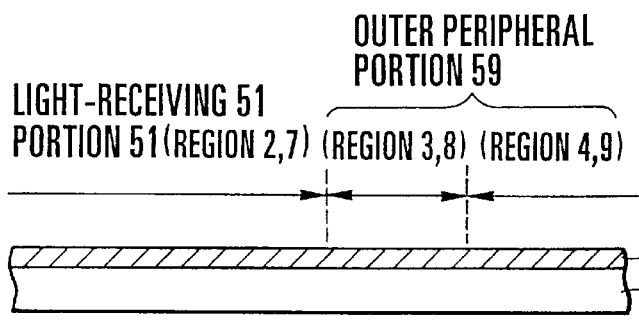
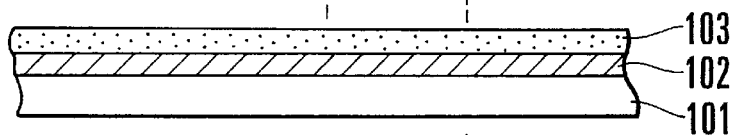
FIG. 2A
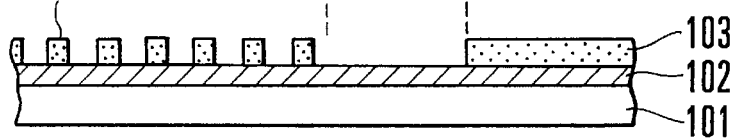
FIG. 2B
FIG. 2C
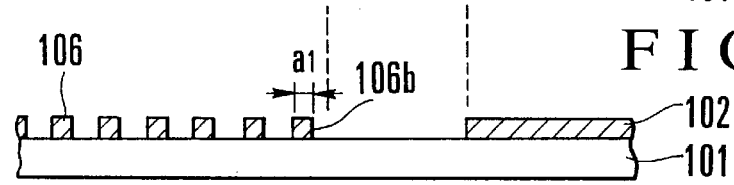
FIG. 2D
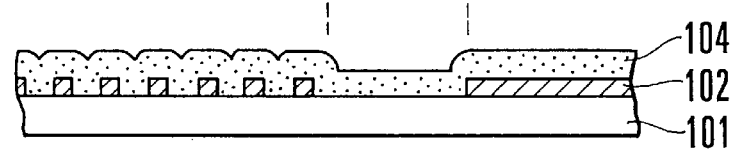
FIG. 2E
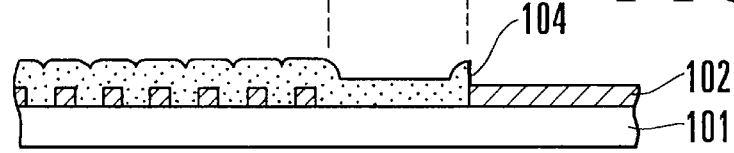
FIG. 2F
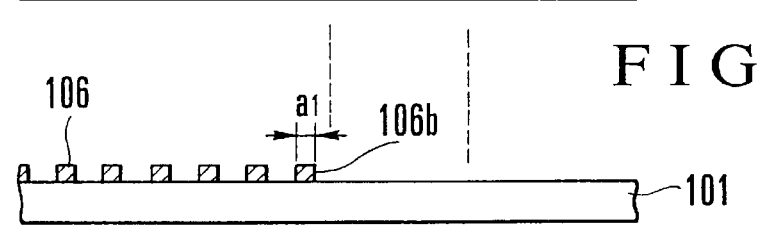
FIG. 2G

| LIGHT-RECEIVING PORTION 51(REGION 62) | OUTER PERIPHERAL PORTION 59(REGION 63) |

SEMICONDUCTOR DEVICE AND METHOD OF MANUFACTURING THE SAME

BACKGROUND OF THE INVENTION

The present invention relates to a semiconductor device manufacturing method and, more particularly, to a semiconductor device manufacturing method in which the uniformity of patterning in the photolithography process (to be referred to as a PR process hereinafter) is improved and a semiconductor device fabricated by this method.

The prior art will be described with reference to FIGS. 6A and 6B, FIGS. 7A and 7B, and FIGS. 8A to 8D. As the prior art, a bolometer type infrared sensor described in Japanese Patent Laid-Open No. 80105794, in which bolometer type thermoelectric conversion elements are regularly formed, will be described, and a PR process for forming a bolometer will be particularly described. This prior art can be applied to a general semiconductor device in which required patterns are regularly formed in a predetermined region.

FIG. 6A shows the arrangement of a two-dimensional bolometer type infrared sensor. An infrared sensor 50 is constituted by a light-receiving portion 51, a horizontal scanner portion 52, a vertical scanner portion 53, and a signal output portion 54.

The light-receiving portion 51 is constituted by a large number of pixels 55 two-dimensionally regularly arranged in a matrix. The vertical scanner portion 53 sequentially selects pixel rows at a horizontal scanning time period so as to read all the pixel rows arranged in the light-receiving portion 51 in the vertical direction within a predetermined vertical scanning time. The horizontal scanner portion 52 selects pixel columns so as to sequentially read signals from the respective pixels 55 arranged in the horizontal direction in the respective pixel rows selected by the vertical scanner portion 53 within a predetermined horizontal scanning time.

The signal output portion 54 outputs the pixels 55 selected by the horizontal scanner portion 52 and vertical scanner portion 53. When the output terminal of the signal output portion 54 is connected to a unit that detects the resistance of the pixels 55, a change in resistance of the pixels 55 is detected, thereby detecting the two-dimensional information on the incident infrared ray. Reference numeral 59 denotes an outer peripheral portion where the horizontal scanner portion 52, the vertical scanner portion 53, and the signal output portion 54 are arranged.

FIG. 6B shows the pixel portion of the sensor shown in FIG. 6A. In each pixel 55, the temperature in the pixel 55 changes in accordance with the incident infrared ray, and the resistance of a bolometer 56 having a width al changes in accordance with this temperature change. This change in resistance is output from the corresponding pixel 55 to the outside as the signal through a pixel selection switch element (not shown) and interconnections 57 and 58 formed in the underlying substrate of the bolometer 56.

In the bolometer type infrared sensor having the above arrangement, the uniformity of the respective pixels 55 is significant. Accordingly, the resistance of the respective pixels 55 arranged two-dimensionally regularly, i.e., the uniformity of the resistance of the bolometers 56, is significant. To realize this uniformity, the interconnection width of the bolometers 56 in the light-receiving portion 51 must be uniformed.

FIG. 7A shows a photomask which is used in the conventional PR process for forming a bolometer and entirely covers the sensor. In this case, the photomask is used for the manufacture of the sensor shown in FIG. 6A. FIG. 7B shows a photomask portion shown in FIG. 7A which corresponds to one pixel portion.

Referring to FIG. 7A, a region 62 of a photomask 61 corresponds to the light-receiving portion 51. A region 63 of the photomask 61 is the surrounding region of the region 62, and corresponds to the outer peripheral portion 59. In the region 62, bolometer patterns 65 used in formation of the bolometers 56 of the light-receiving portion 51 are formed each with the predetermined width al to correspond to each pixel 55, as shown in FIG. 7B. Since the region 63 does not correspond to the light-receiving portion 51, it is made of a transparent material so that no patterns by the bolometer material layer are formed.

FIGS. 8A to 8D show a manufacturing method of forming the bolometers of the light-receiving portion. FIGS. 8A to 8D schematically show a section taken along the line A–A' of FIG. 6A and illustrate a case wherein the bolometers are formed by using the photomask 61 of FIG. 7A.

As shown in FIG. 8A, a bolometer material layer 202 serving as the material of the bolometers is deposited on an underlying substrate 201. As shown in FIG. 8B, a photoresist 203 is uniformly applied onto the bolometer material layer 202.

Subsequently, bolometer patterns 56 each shown in FIG. 7B is exposed within the light-receiving portion 51 (region 62) by using the photomask 61 of FIG. 7A, and is developed, to form bolometer patterns in the photoresist 203, as shown in FIG. 8C. At this time, on the outer peripheral portion 59 (region 63), the photoresist 203 is completely removed.

Using the photoresist 203 formed with the bolometer patterns as the mask, etching, e.g., plasma etching, is performed for the bolometer material layer 202 to form bolometers 206. At this time, on the outer peripheral portion 59 (region 63), the bolometer material layer 202 is completely etched and removed. Then, as shown in FIG. 8D, the photoresist 203 on the bolometers 206 is removed.

A bolometer 206b formed near the boundary of the light-receiving portion 51 is weakly developed and etched during the process of FIG. 8C to FIG. 8D. Accordingly, the bolometer 206b has a width a2 larger than the bolometer width al as the designed value on the photomask 61, and the pattern uniformity is degraded. The phenomenon wherein development and etching become weak near the boundary of the light-receiving portion 51 is called "microloading effect".

The "microloading effect" occurs when a wide region (region), e.g., the outer peripheral portion 59 (region 63), is removed around a region (pattern region), e.g., the light-receiving portion 51 (region 62), where regular patterns are formed, during formation of the bolometers. More specifically, in order to develop a photoresist or to etch a bolometer material layer over a wide region, larger amounts of developing agent, etching gas, and the like are used in the non-pattern region than in the pattern region. Accordingly, development and etching become relatively weak near the boundary of the non-pattern region, and a predetermined amount of development or etching is not performed. As a result, the width of the formed pattern becomes larger than the designed value of the photomask, and the pattern uniformity is degraded.

In FIG. 8D, only one bolometer 206b is wider than the predetermined width al. In fact, however, the width of the bolometers 206 gradually increases from the predetermined width al as it is closer to the boundary. In contrast to this, at a place remote from the boundary by a distance equal to or larger than a value to be described later, the width of the bolometers 206 is a predetermined value al, which is uniform.

As described above, since the width of the bolometer 206 of the pixel 55 located near the boundary between the light-receiving portion 51 and the outer peripheral portion 59 becomes larger than the predetermined value, the resistance of the bolometer 206 is decreased, and the uniformity of the resistance of the bolometers 206 in the light-receiving portion 51 is degraded.

In order to improve this pattern non-uniformity occurring near the boundary of the light-receiving portion 51, for example, Japanese Patent Laid-Open No. 63-17528 describes a method of forming regular dummy patterns also on the outer peripheral portion 59 of a predetermined region (pattern region) where regular patterns are formed.

The conventional method described above has problems as follows.

According to the first problem, when the dummy patterns are formed on the outer peripheral portion of the pattern region, an inconvenience such as degradation in characteristics of the semiconductor device occurs. This occurs when a different interconnection layer is formed under a layer where regular patterns are formed in the pattern region, not interposing an insulating protective layer. In other words, due to etching in the PR process of the dummy patterns, a specific portion of the underlying interconnection layer may become thin depending on the shape of the dummy patterns, to degrade the characteristics of the underlying interconnection layer or to short-circuit the underlying interconnection layer.

According to the second problem, when no dummy pattern is formed in order to avoid the first problem, the pattern width increases near the boundary of the pattern region, as described above, to degrade the uniformity. For example, in the bolometer type infrared sensor, the line width of the bolometer formed near the boundary of the light-receiving portion becomes larger than a predetermined value, and the uniformity of the resistance of the bolometers in the light-receiving portion is degraded.

The reason for this is as follows. As described above, during formation of the bolometers, when a wide region around the light-receiving portion is etched, the photoresist is developed weakly and the bolometer material layer is developed weakly near the boundary of the light-receiving portion (microloading effect), and a predetermined amount of etching is not performed.

When no dummy pattern is formed on the outer peripheral portion, due to the in-surface non-uniformity of the resistance, a sufficiently high gain cannot be obtained in a bolometer resistance detection circuit, and the S/N ratio of the detector does not increase.

This results from large variations in bolometer resistance near the boundary of the light-receiving portion as compared to a change in resistance of the bolometer in accordance with the incident infrared ray. When a signal including an offset component caused by the variations in resistance is to be set within the dynamic range of the detection circuit, the amplifier gain of the detection circuit is limited due to the variations in resistance. Accordingly, the amplifier gain cannot be increased when compared to a case free from variations in resistance. As a result, the signal component cannot be sufficiently increased, and the S/N ratio cannot be sufficiently improved against noise from the detection circuit and the like.

In order to cope with these problems, i.e., in order to increase the amplifier gain so as to obtain a high S/N ratio, if a circuit for correcting the variations in resistance is used, the size of the sensor circuit is increased, and the power consumption and the like are increased, leading to secondary problems.

SUMMARY OF THE INVENTION

It is an object of the present invention to provide a method of manufacturing a semiconductor device excellent in pattern uniformity within a predetermined region having required patterns without forming dummy patterns.

It is another object of the present invention to provide a semiconductor device having a small circuit size, small power consumption, and a high S/N ratio.

In order to achieve the above objects, according to the present invention, there is provided a semiconductor device manufacturing method, comprising the steps of uniformly applying a first photoresist onto a first layer on a semiconductor substrate, forming a first resist pattern out of the first photoresist by using a first photomask, etching the first layer by using the resist pattern, thereby forming a first pattern, uniformly applying a second photoresist onto the semiconductor substrate where the first pattern is formed, forming a second resist pattern out of the second photoresist by using a second photomask, and etching the first pattern by using the second photoresist, thereby forming a second pattern constituted by the first layer.

BRIEF DESCRIPTION OF THE DRAWINGS

FIGS. 2A to 2G are views showing steps in a semiconductor device manufacturing method according to the first embodiment of the present invention;

DESCRIPTION OF THE PREFERRED EMBODIMENTS

First of all, the principle of the present invention will be explained.

Concerning a method of manufacturing a general semiconductor device in which required patterns are regularly formed within a predetermined region, the present invention uses the first and second photomasks in formation of the required patterns. The first photomask has a pattern which is divided into the first, second, and third regions. The first region corresponds to the predetermined region where the required patterns are formed regularly. The second region is a region around the first region. In the second region, the first layer as the target of the PR process is completely removed in order to adjust the strengths of the developing and etching functions near the boundary of the first region to be equal to those in the first region. The third region is located around the second region. In the third region, the first layer is not removed but is left completely. The second photomask has such a pattern that, in the first and second regions, the first layer as the target of the PR process, is not removed but is left completely, and that in the third region, the first layer is removed completely.

First, the first photoresist is applied onto the first layer. Thereafter, required patterns are exposed on the first photoresist by using the first photomask, and is developed. Subsequently, the first layer is etched by using the first photoresist (first PR process).

The second photoresist is applied. Thereafter, required patterns are exposed on the second photoresist by using the second photomask, and is developed. Subsequently, the first layer is etched by using the second photoresist (second PR process).

With this method of the present invention, no dummy pattern or the like need be formed around the predetermined region where the required patterns are regularly formed, and the regular required patterns can be uniformly formed within the predetermined region without being influenced by a dummy pattern or the like.

The present invention will be described in detail with reference to the accompanying drawings.

First Embodiment

The semiconductor device manufacturing method according to the present invention can be applied to a general semiconductor device in which required patterns are regularly formed within a predetermined region. In this embodiment, a case will be described wherein the present invention is applied to a bolometer type infrared sensor in which bolometers serving as thermoelectric conversion elements are regularly formed. The arrangement of a bolometer type infrared sensor having a light-receiving portion 51 and an outer peripheral portion 59 is the same as that shown in FIGS. 6A and 6B, and a description thereof will thus be omitted.

Figure 1A:
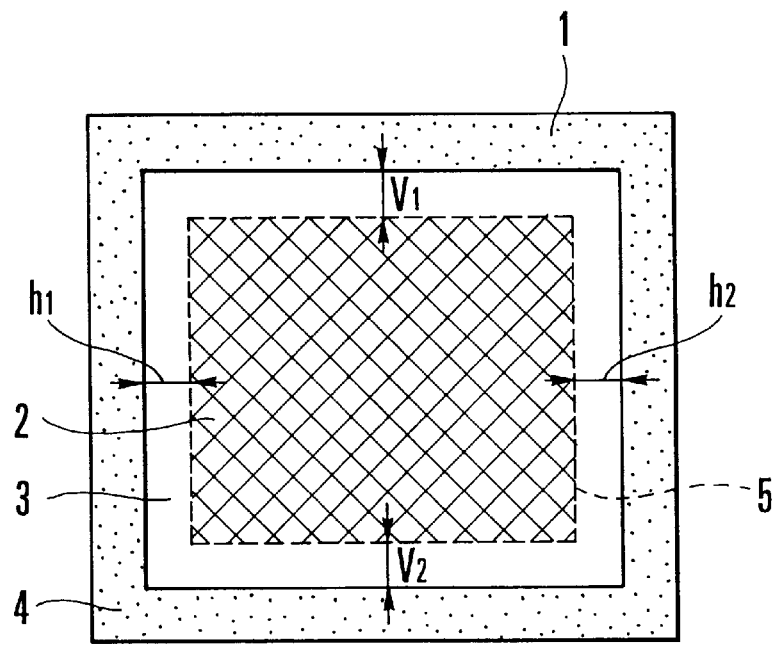
FIGS. 1A and 1B are plan views of two photomasks used in a semiconductor device manufacturing method shown in FIGS. 2A to 2G.
Figure 1B:
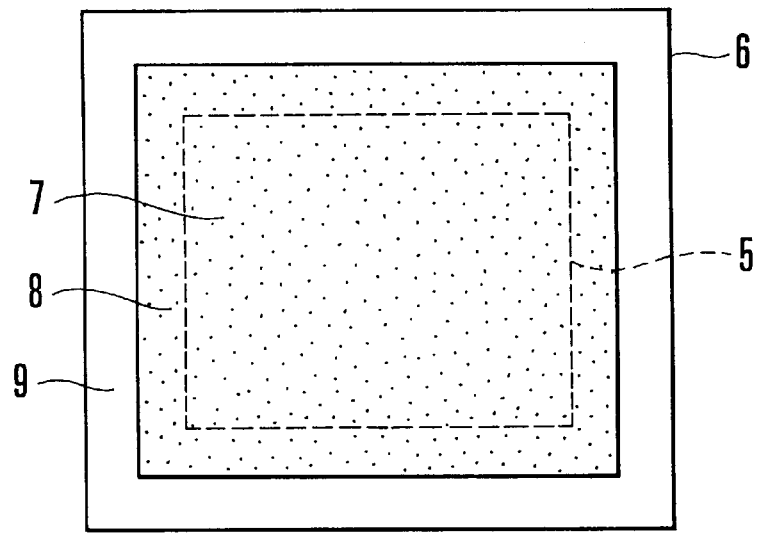

FIGS. 1A and 1B show two photomasks used in the semiconductor device manufacturing method shown in FIGS. 2A to 2G. First and second photomasks 1 and 6 are respectively used in the first and second PR processes of forming bolometers of the entire bolometer type infrared sensor. Note that a predetermined number of infrared sensors are repeatedly formed on the wafer in the horizontal and vertical directions.

A case using positive photoresists will be described. The first photomask 1 shown in FIG. 1A is constituted by three regions, i.e., regions 2, 3, and 4 described above.

Figure 6A:
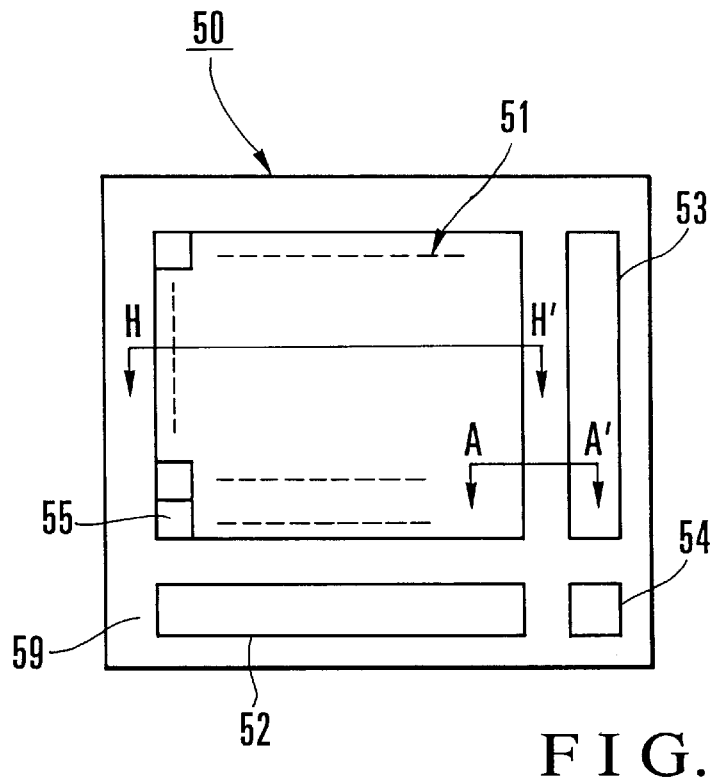
FIG. 6A is a view showing the arrangement of a bolometer type infrared sensor.
Figure 6B:
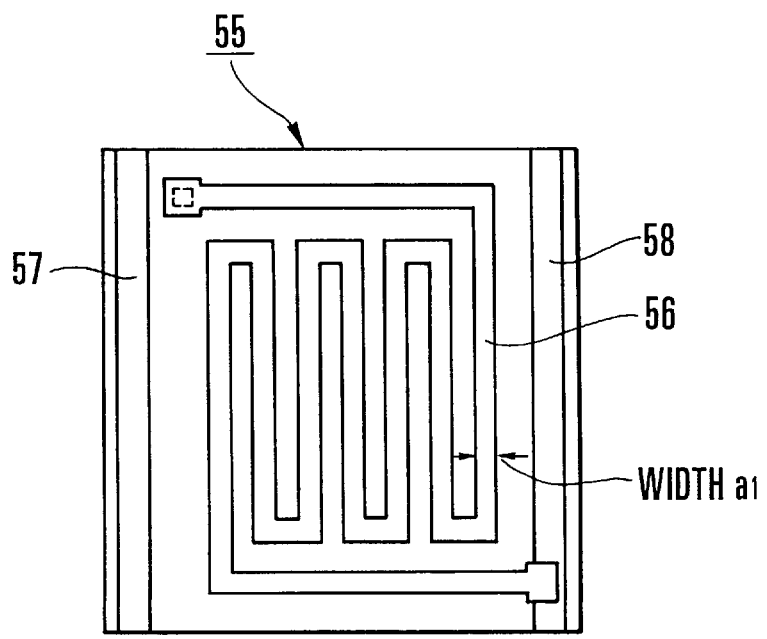
FIG. 6B is a plan view of each pixel constituting the light-receiving portion shown in FIG. 6A.
Figure 7A:
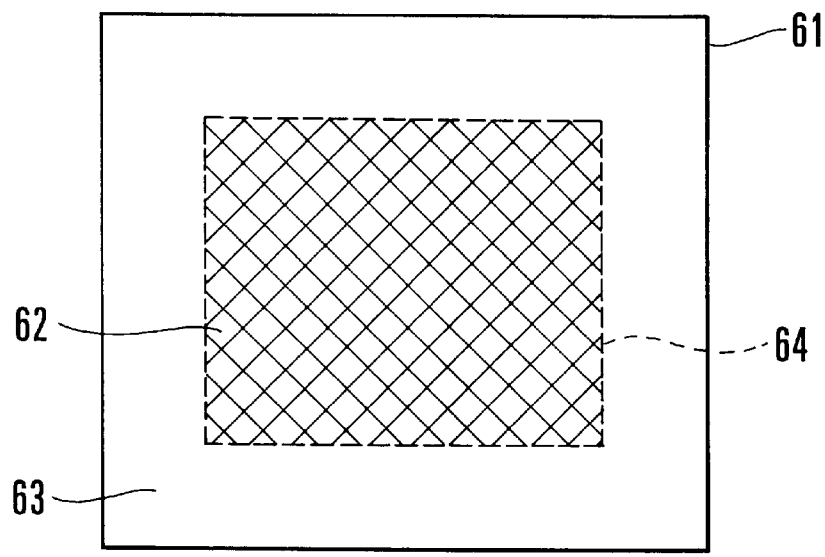
FIG. 7A is a view showing the arrangement of a photomask used in a conventional manufacturing method.
Figure 7B:
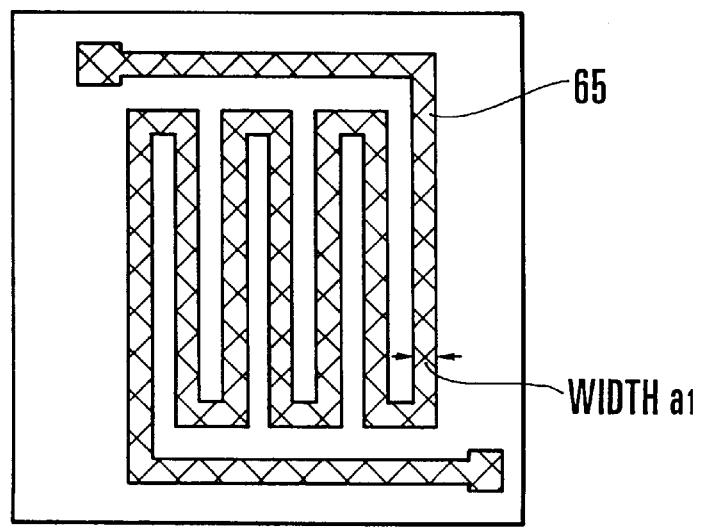
FIG. 7B is an enlarged plan view of a pixel portion of the photomask shown in FIG. 7A.
Figure 8A:
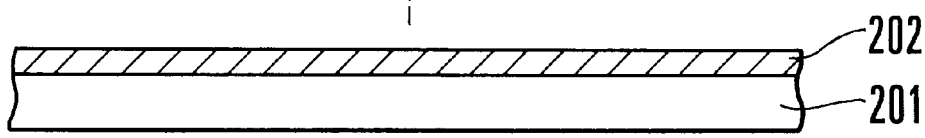
FIGS. 8A to 8D are views showing steps in a conventional semiconductor device manufacturing method.
Figure 8B:
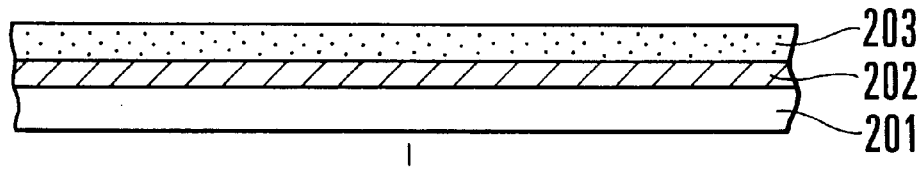
Figure 8C:
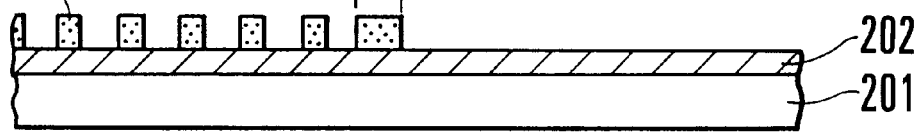
Figure 8D:
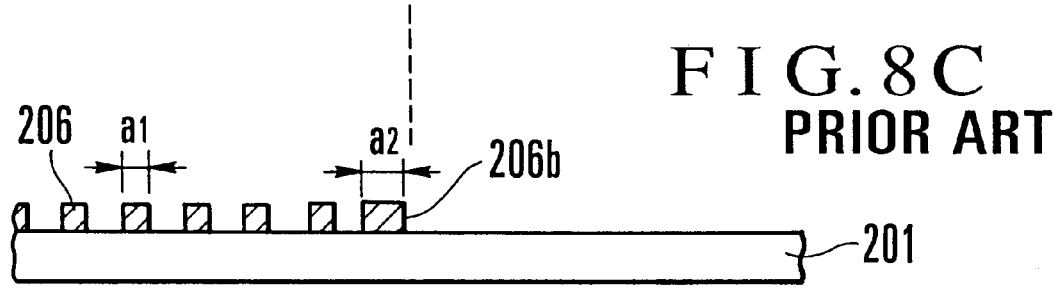

The region 2 is surrounded by a light-receiving portion boundary 5 indicated by a broken line and corresponds to the light-receiving portion 51 of the infrared sensor shown in FIG. 6A. In the region 2, bolometer patterns 65 each shown in FIG. 7B are two-dimensionally repeatedly formed to form the bolometers of the respective pixels constituting the light-receiving portion 51.

In the first PR process (FIGS. 2A to 2D) using the first photomask 1, a bolometer material layer 102 serving as the material of the bolometer is etched to leave bolometer patterns, and bolometers 106 are formed to correspond to the bolometer patterns.

The region 3 is a region around the region 2, as shown in FIG. 1A, and has widths of predetermined values h1 and h2 at on its left and right portions in the horizontal direction in FIG. 1A and widths of predetermined values v1 and v2 at its upper and lower portions in the vertical direction in FIG. 1A. The entire region 3 is transparent so that the bolometer material layer 102 is completely removed from the region 3 in the first PR process.

The region 4 is a region around the region 3, as shown in FIG. 1A, and extends outward as far as to the outermost outline of the infrared sensor. The entire region 4 is light-blocked so that the bolometer material layer 102 is not etched but is completely left in the first PR process.

The second photomask 6 shown in FIG. 1B is constituted by three regions, i.e., regions 7, 8, and 9 to correspond to the first photomask 1 shown in FIG. 1A.

The region 7 is surrounded by a light-receiving portion boundary 5 indicated by a broken line and corresponds to the region 2. The entire region 7 is light-shielded so the bolometer material layer 102 formed in the first PR process is not etched in the second PR process that uses the second photomask 6. Although the regions 7 and 8 are described separately, they form one light-shielding region in the second photomask 6.

The region 8 is a region around the region 7, in the same manner as the region 3 of the mask shown in FIG. 1A, and has widths of predetermined values h1 and h2 at its left and right portions in the horizontal direction and widths of predetermined values v1 and v2 at its upper and lower portions in the vertical direction. The entire region 8 is also light-blocked so the layer underneath of the bolometer material layer 102 is not etched in the second PR process.

The region 9 is a region around the region 8 and corresponds to the region 4. The region 9 extends up to the outermost outline of the infrared sensor. The entire region 4 is transparent so that the bolometer material layer 102 which is not etched but is left in the first PR process is completely removed in the second PR process.

The widths h1 and h2 in the horizontal direction and the widths v1 and v2 in the vertical direction of the region 2 are determined by the to-be-etched area of the bolometer material layer 102 in the light-receiving portion 51 and the like, and will be described later.

In the above description, the positive photoresists are used. Negative photoresists can be used if the light-shielding portion of the photomask is inverted.

If a shift amount A is present in the PR process, the widths h1 and h2, and v1 and v2 of the region 8 may be decreased by A so that short-circuiting or the like will not be caused by the bolometer material layer 102 which is left in the form of thin stripes (width: Δ). For example, the widths h1 and h2, and v1 and v2 of the region 8 may preferably be decreased by Δ=about 0.2 $\mu$m.

FIGS. 2A to 2G show the steps in a semiconductor device manufacturing method according to the first embodiment of the present invention. Sections taken along the line A–A' of FIG. 6A are schematically shown concerning the manufacturing process of forming the bolometers of the light-receiving portion 51.

As shown in FIG. 2A, the bolometer material layer 102 serving as the material of the bolometers, i.e., the thermoelectric elements, is uniformly formed on an underlying substrate 101. As the bolometer material, for example, titanium or a material containing titanium as the main component can be used.

As the underlying substrate 101, for example, a pixel selection switching element, ordinary MOS transistor circuits constituting scanning circuits, e.g., a horizontal scanner and a vertical scanner are formed on a semiconductor substrate. In order to form the MOS transistor circuits and the like, various types of layers are formed in the underlying substrate 101 and are patterned in accordance with a predetermined manner. A silicon oxide film and the like are formed, and furthermore a contact, an interconnection, and the like made of aluminum or a material containing aluminum as the main component are formed. This will be described later in more detail with reference to FIG. 5.

As shown in FIG. 2B, a first photoresist 103 is uniformly applied onto the bolometer material layer 102.

By using the first photomask 1 (FIG. 1A), the first photoresist 103 is exposed and developed, to form a bolometer pattern 103a in the first photoresist 103 within the light-receiving portion 51 (region 2). In the region 3, the first photoresist 103 is entirely removed. In the region 4, the first photoresist 103 is not removed but is left entirely.

By using the first photoresist 103 as the mask, the bolometer material layer 102 is subjected to etching, e.g., plasma etching, and the first photoresist 103 is removed. Accordingly, as shown in FIG. 2D, the bolometers 106 are formed in the light-receiving portion 51 (region 2), the bolometer material layer 102 is completely removed in the region 3, and the bolometer material layer 102 is completely left in the region 4. The first PR process has been described above.

As shown in FIG. 2E, a second photoresist 104 is uniformly applied onto the underlying substrate 101 that has been subjected to the first PR process.

Subsequently, by using the second photomask 6 (FIG. 1B), the second photoresist 104 is exposed and developed, to remove the second photoresist 104 in the region 9, as shown in FIG. 2F.

By using the second photoresist 104 as the mask, the bolometer material layer 102 is subjected to etching, e.g., plasma etching, and the second photoresist 104 is removed (FIG. 2G). In this process, the bolometer material layer 102 in the region 9 is removed completely. The second PR process has been described so far.

Through the first and second PR processes described above, in the light-receiving portion 51, the bolometers 106 are formed out of the bolometer material layer 102, and in the outer peripheral portion 59 of the light-receiving portion 51, the bolometer material layer 102 is completely removed. The width of a bolometer 106b formed near the boundary between the light-receiving portion 51 and outer peripheral portion 59 is equal to the width al (FIG. 7B) as the designed value, and the width of the bolometers 106 within the light-receiving portion 51 is formed uniform.

According to the first and second PR processes described above, a so-called "microloading effect", that the developing function and etching function are weakened near the boundary of the light-receiving portion 51 during formation of the bolometers 106, can be prevented. This is because in the conventional method, the bolometer material layer 202 on the entire surface of the sensor chip of the outer peripheral portion 59 is removed at once, whereas in this embodiment, the bolometer material layer 102 of the outer peripheral portion 59 is removed in a two-step manner.

More specifically, according to this embodiment, the annular region 3, from which the bolometer material layer 102 is to be removed from the boundary of the light-receiving portion 51, is formed around the light-receiving portion 51 to have a predetermined width, so that the area which is to be removed at once is decreased to be smaller than that in the conventional case. The width of the patterns to be formed near the boundary can be controlled by adjusting the width of the region 3. The bolometers 106 having the predetermined width al can accordingly be formed in the light-receiving portion 51, and the resistance of the bolometers 106 becomes uniform.

Figure 3:
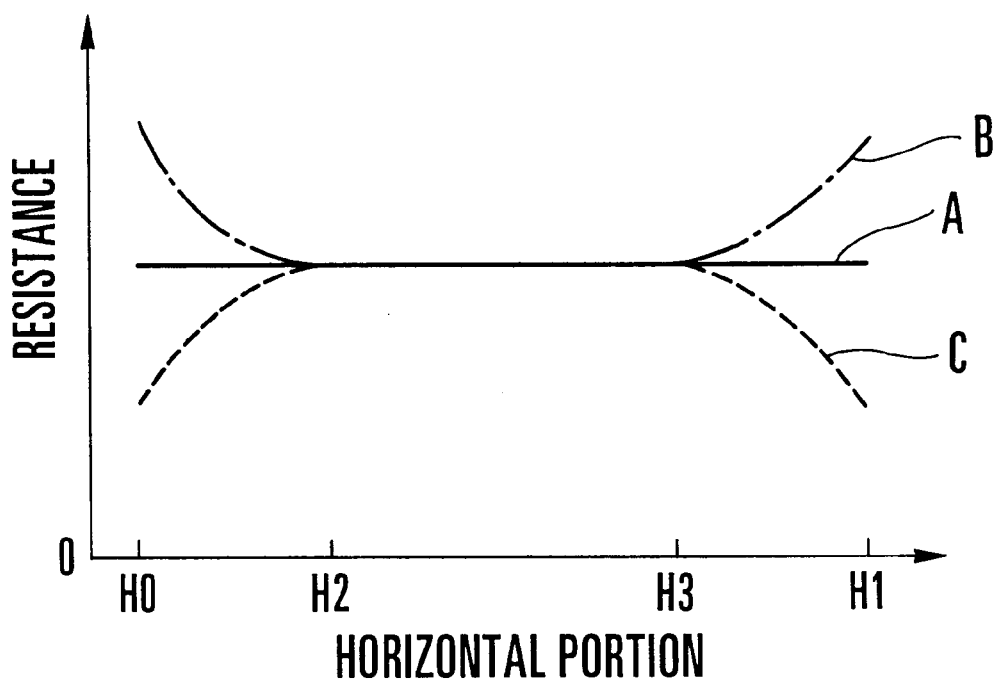
FIG. 3 is a graph showing a bolometer resistance in the horizontal direction of a semiconductor device according to the present invention.

FIG. 3 shows the resistance characteristics of the bolometers in the horizontal direction of a semiconductor device fabricated by the manufacturing method of the present invention. The horizontal direction corresponds to the line H–H' of FIG. 6A. Horizontal positions H0 and H1 in FIG. 3 denote the left and right boundaries of the light-receiving portion 51.

A curve A indicates the resistance characteristics of the bolometers of the semiconductor device fabricated by the manufacturing method of the present invention. In this case, as the widths h1 and h2 in the horizontal direction of the region 3 of FIG. 1A, predetermined values to be described later are used. The bolometer resistance within the light-receiving portion 51 is uniform.

A curve B indicates the resistance characteristics of the bolometers which are subjected to the same process as in the present invention but with the width h1=h2=0 (the regions 3 and 8 do not exist) in FIG. 1A. In this case, since the regions 3 and 8 do not exist, the region to be etched near the boundary is small when compared to the patterns regularly arranged in the light-receiving portion 51. Hence, as compared to the effect in the light-receiving portion 51, opposite to the "microloading effect", the developing or etching function becomes relatively strong near the boundary, the interconnection width of the bolometers is decreased, and the resistance is increased. In particular, the closer to the boundary, the more intense this tendency. An increase in resistance of about 5% at maximum is caused.

A curve C indicates the resistance characteristics of the bolometers which are subjected to the PR process by the conventional method. In this case, the developing or etching function becomes relatively weak due to the "microloading effect", the interconnection width of the bolometers near the boundary is increased, and the resistance is decreased. In particular, the closer to the boundary, the more intense this tendency. A decrease in resistance of about 5% at maximum is caused.

As indicated by the curve A, the values of the widths h1 and h2, and v1 and v2 of the region 3 of the first photomask 1, with which the bolometer resistance in the light-receiving portion 51 is substantially uniform, depend on the proportion of the bolometer area in each pixel, the chip-to-chip gap of the infrared sensor formed on the wafer, and the like.

As an example, referring to FIG. 6A, it was confirmed through experiments that, when each pixel was about 50 $\mu$m square, the bolometer width was 1 $\mu$m to 10 $\mu$m, the bolometer pitch was 0.5 $\mu$m to 2 $\mu$m, the bolometer thickness was 500 Å to 3,000 Å, the number of pixels 55 of the light-receiving portion 51 was several hundreds in each the horizontal and vertical directions, and the chip pitch was 10,000 $\mu$m to 20,000 $\mu$m, the values of the widths h1 and h2, and v1 and v2 may well be set to 50 $\mu$m to 1,600 $\mu$m. In particular, in the bolometer type infrared sensor, even when the pixel size was 20 $\mu$m to 100 $\mu$m square, if the widths h1 and h2, and v1 and v2 were set to fall almost within the above range, a uniform resistance was obtained.

If the values of the widths h1 and h2, and v1 and v2 are equal to or larger than 50 $\mu$m, a sufficiently large distance is ensured between the region 4 or 9 and the boundary of the light-receiving portion 51. Since the region 3 or 8 is sufficiently large in the outer peripheral portion 59 when compared to that in the light-receiving portion 51, the developing or etching function will not become strong near the boundary of the light-receiving portion 51 in the opposite manner to the "microloading effect". As a result, the interconnection width of the bolometers will not be decreased to increase the resistance, but the resistance becomes uniform. If the values of the widths h1 and h2, and v1 and v2 are equal to or smaller than 1,600 μm, the region 3 or 8 to be etched is not excessively large, the interconnection width will not be increased due to the "microloading effect" to decrease the resistance, and the resistance becomes uniform.

Referring to FIG. 3, horizontal positions H2 and H3, where a difference starts to occur in the bolometer resistances indicated by the curves A, B, and C, also depend on the proportion of the bolometer area in the pixel 55, the chip pitch of the infrared sensor formed on the wafer, and the like. In the example described above, the horizontal positions H2 and H3 are the horizontal positions inside the boundary of the light-receiving portion 51 by about 500 am. Regarding the vertical direction as well, the positions H2 and H3 are inside the boundary of the light-receiving portion 51 by about 500 μm. The resistance characteristics of the bolometers in the vertical direction also exhibit a tendency similar to that in FIG. 3, and they will accordingly be omitted.

Second Embodiment

Figure 4A:
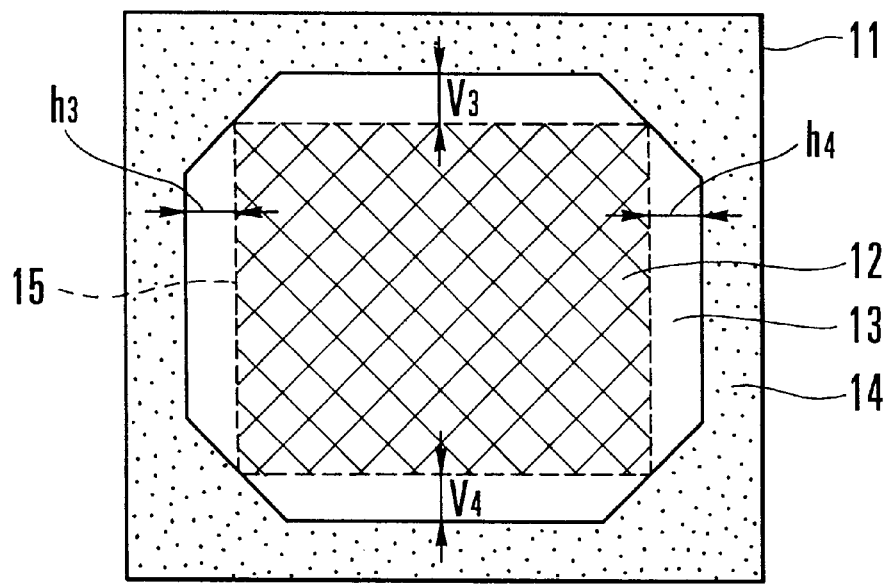
FIGS. 4A and 4B are plan views of two photomasks used in a semiconductor device manufacturing method according to the second embodiment of the present invention.
Figure 4B:
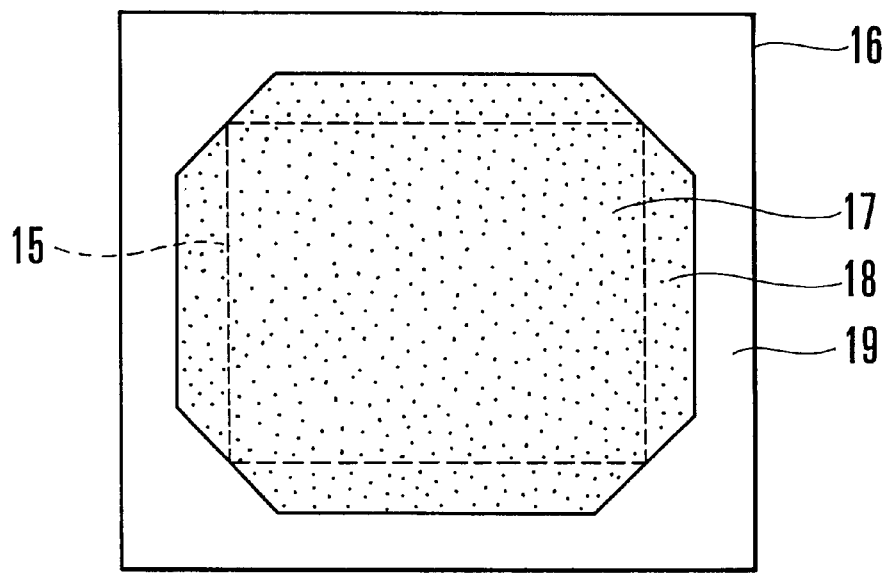

FIGS. 4A and 4B show two photomasks that explain the second embodiment of the present invention. First and second photomasks 11 and 16 are respectively used in the first and second PR processes of forming bolometers in the infrared sensor shown in FIG. 6A, in the same manner as in the first embodiment.

When the first and second photomasks 11 and 16 shown in FIGS. 4A and 4B are compared to the first and second photomasks shown in FIGS. 1A and 1B, the shape of a region 13 around a light-receiving portion 15 is different. The shapes of regions 14, 18, and 19 are also different in accordance with the shape of the region 13. The patterns of the respective regions are similar to those shown in FIGS. 1A and 1B except that their shapes are different, and a description thereof will thus be omitted.

The region 13 has a trapezoidal shape that comes in contact with the outer sides of the four sides of a region 12 corresponding to a light-receiving portion 51. The region 13 has widths of predetermined values h3 and h4 at its left and right portions in the horizontal direction and widths of predetermined values v3 and v4 at its upper and lower portions in the vertical direction. This shape is employed for the following reason.

Near the four corners of the region 12 corresponding to the light-receiving portion 51, the area occupied by the light-receiving portion 51 is small, and the developing agent and etchant are consumed in this vicinity in a high amount during development and etching of the region 13. Hence, in the conventional PR process, the developing and etching functions became particularly weak, and the pattern uniformity was poor. In order to solve this, the region 13 which is to be removed by the first PR process must be made narrow near the four corners, so that the developing and etching functions in this vicinity become equal to those in the vicinities of other light-receiving portion boundary. For this purpose, a shape like that of the region 13, the width of which decreases as it is closer to the four corners, is preferable. With this simple shape, the pattern design is facilitated, which is more preferable.

According to this embodiment, the strengths of the developing and etching functions near the boundary of the light-receiving portion 51 can be made equal to those as in the light-receiving portion 51, and the bolometer patterns and the bolometer resistance in the light-receiving portion 51 can be uniformed.

The shape of the region 13, from which the bolometer material layer is to be removed completely around the light-receiving portion 51, is not limited to the shape of this embodiment or the shape of the region 3 shown in the first embodiment. It suffices as far as the region 13 is located around the light-receiving portion 51 and has such a shape that the strengths of the developing and etching functions near the boundary of the light-receiving portion 51 become equal to those in the light-receiving portion 51.

Third Embodiment

Figure 5:
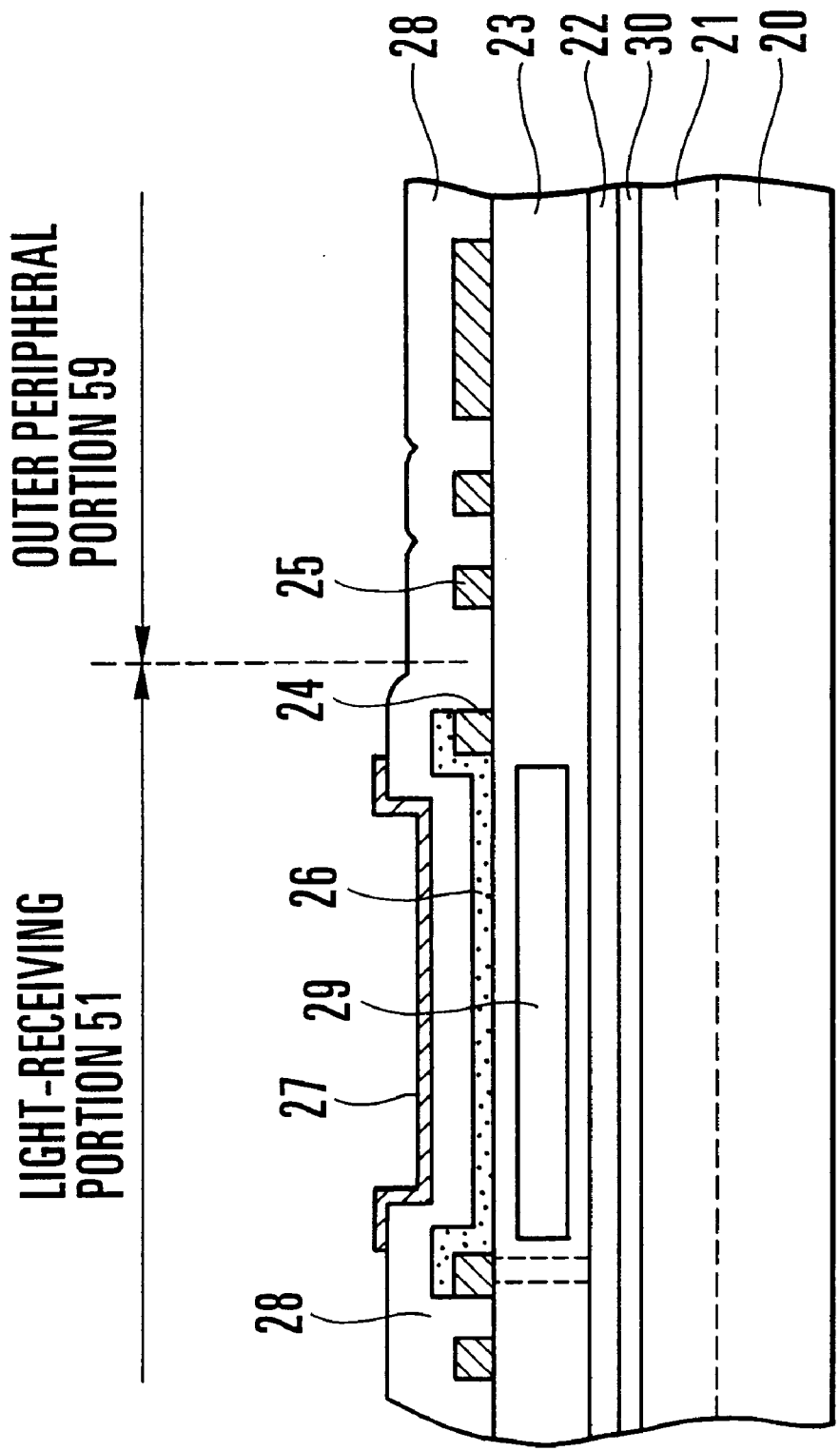
FIG. 5 is a sectional view of a semiconductor device according to the present invention.

FIG. 5 shows a bolometer type infrared sensor fabricated by the manufacturing method according to the present invention.

In the bolometer type infrared sensor of this embodiment, a scanning circuit 21, e.g., the switching element of a light-receiving portion 51 and the vertical scanner portion of an outer peripheral portion 59, is formed on a semiconductor substrate 20. An interconnection layer 22, e.g., the gate interconnection of the scanning circuit 21, is formed on the scanning circuit 21 through a silicon oxide film 30, and a thick silicon oxide film 23 is formed on the interconnection layer 22.

In the region of the light-receiving portion 51, a predetermined space 29 is formed in the silicon oxide film 23 to correspond to each pixel. An interconnection layer 24, made of a conductive material, e.g., aluminum or a material containing aluminum as the main component, and the like are formed on the silicon oxide film 23. Furthermore, a bolometer 26 serving as the thermoelectric conversion element is directly formed on the silicon oxide film 23 and interconnection layer 24 by using, e.g., titanium or a material containing titanium as the main component, without forming an interlayer insulating film, e.g., a silicon oxide film. A metal layer 27 for improving the infrared absorption rate is formed on the bolometer 26 through a silicon oxide film 28.

In the region of the outer peripheral portion 59, an interconnection layer 25 for a peripheral circuit, e.g., the vertical scanner portion, and the like are formed on the silicon oxide film 23, and the silicon oxide film 28 is formed on the interconnection layer 25 and the like.

In the region of the light-receiving portion 51, the interconnection layer 24 and the bolometer 26 are formed in contact with each other without interposing an interlayer insulating film therebetween due to the following reason.

When the bolometer 26 is made of titanium or a material containing titanium as the main component, if the interconnection layer 24 is formed after formation of the bolometer material layer, the temperature coefficient of the resistance of the bolometer material layer is decreased due to the heat treatment or the like that aims at improving the interconnection characteristics, and the sensitivity of the bolometer is degraded. Hence, it is preferable to form the interconnection layer 24 before formation of the bolometer material layer.

If an interlayer insulating film is formed on the interconnection layer 24 having a thickness of about 2 μm, the inclination of the interlayer insulating film on the side surface of the interconnection pattern becomes sharper. Accordingly, the bolometer material layer formed on the inclined interlayer insulating film causes poor step coverage near its side surface to be electrically opened. Then, a signal from the pixel may not be read out. For this reason, in order to ensure the electrical connection between the bolometer 26 and the interconnection layer 24, it is preferable to form the interconnection layer 24 without interposing an interlayer insulating film.

If an interlayer insulating film is formed on the interconnection layer 24, a contact must be formed to connect the bolometer 26 and the interconnection layer 24 to each other. When this contact is formed, the light-receiving region that absorbs the infrared ray within the pixel is decreased (the aperture rate is decreased), and the sensitivity is decreased. This poses a serious problem particularly when micropatterning the pixels. Therefore, to realize micropatterning while preventing a decrease in sensitivity, it is preferable to form the bolometer 26 directly on the interconnection layer 24.

From the above reasons, when a bolometer type infrared sensor, in which the bolometer 26 and the interconnection layer 24 are formed not through an interlayer insulating film, is to be manufactured, as shown in FIG. 5, the first PR process that uses the first photomask and the second PR process that uses the second photomask, according to the present invention are suitable.

In this manner, when the present invention is applied to formation of the bolometers of the bolometer type infrared sensor, the bolometers in the light-receiving portion can be formed uniformly, and the resistance of the bolometers can be uniformed. As a result, the gain of the detection circuit of the bolometer type infrared sensor can be increased, so that the S/N ratio can increase.

A specific circuit that corrects the non-uniformity of the bolometer resistance in the light-receiving portion surface is not required. For example, since a circuit for correcting variations in resistance, and the like are not necessary, the circuit configuration of the infrared sensor unit is simplified, downsizing the unit and decreasing power consumption.

According to the first effect of the present invention, regular required patterns can be uniformly formed within a predetermined region without forming a dummy pattern, unlike in the conventional case. Hence, for example, in the bolometer type infrared sensor, the resistances of the bolometers can be uniformed within the light-receiving portion surface.

This is because the PR process in formation of the required patterns, e.g., bolometers, is performed in the two-step manner. In the first PR process that uses the first photomask, when the region, which is to be formed around the light-receiving portion and from which the bolometer material layer is to be removed at once, is adjusted to be narrow appropriately, a decrease in developing and etching functions near the boundary of the light-receiving portion, or the so-called the "microloading effect", which occurs in the prior art, can be prevented.

According to the second effect, when the manufacturing method of the present invention is used in the manufacture of the bolometer type infrared sensor, the gain of the detection circuit can be increased. Accordingly, the S/N ratio of the bolometer type infrared sensor can increase.

The reason for this is as follows. In the prior art, since the resistance in the light-receiving portion is non-uniform, if the gain is increased, it exceeds the upper limit of the dynamic range of the detection circuit, and an increase in gain cannot sufficiently improve the detection sensitivity. According to the present invention, however, since the resistance of the bolometers is uniformed, the gain of the detection circuit can be improved.

According to the third effect, a specific circuit that corrects the non-uniformity of the bolometer resistance in the light-receiving portion surface is not required. Accordingly, for example, a circuit for correcting variations in resistance, and the like become unnecessary, so that the circuit configuration of the infrared sensor unit is simplified, downsizing the unit and decreasing power consumption.

This is because according the manufacturing method of the present invention, the bolometer resistance on the light-receiving surface is uniformed, so that correction of the resistance becomes unnecessary.

What is claimed is:

1. A semiconductor device manufacturing method, comprising the steps of:

uniformly applying a first photoresist onto a first layer, wherein said first layer is formed on a semiconductor substrate;

forming a first resist pattern out of said first photoresist by using a first photomask;

etching said first layer by using said first resist pattern, thereby forming a first pattern, wherein said first pattern comprises an active portion, a first peripheral portion surrounding said active portion, and a second peripheral portion surrounding said first peripheral portion, wherein all of said first layer is removed from said first peripheral portion and none of said first layer is removed from said second peripheral portion during said etching of said first layer, and wherein said active portion is patterned to comprise a plurality of regular patterns formed by removing only predetermined areas of said first layer;

uniformly applying a second photoresist onto said semiconductor substrate where said first pattern is formed;

forming a second resist pattern out of said second photoresist by using a second photomask; and etching said first pattern by using said second [photoresist] resist pattern, thereby forming a second pattern constituted by said first layer, wherein said second pattern comprises said active portion, a third peripheral portion surrounding said active portion and coextensive with said first peripheral portion, a fourth peripheral portion surrounding said third peripheral portion and coextensive with said second peripheral portion, and wherein all of said first layer is removed from said fourth peripheral portion during said etching of said first pattern.

2. A method according to claim 1, further comprising:

forming said first photomask, which comprises:

a first region, corresponding to said active portion, for forming said regular patterns in said first layer;

a second region, corresponding to said first peripheral portion, that surrounds said first region with a width and serves to entirely remove said first layer; and a third region, corresponding to said second peripheral portion, that surrounds said second region and serves to entirely leave said first layer; and forming said second photomask which comprises:

fourth and fifth regions respectively corresponding to said first and second regions and serving to entirely leave said first layer; and a sixth region corresponding to said third region and serving to entirely remove said first layer.

3. A method according to claim 2, wherein the width of said second region is 50 μm to 1,600 μm.

4. A method according to claim 1, wherein said first layer is made of a thermoelectric conversion material.

5. A method according to claim 1, wherein said first layer is directly formed on a second layer having conductivity.

6. A method according to claim 5, wherein said first layer is made of one member selected from the group consisting of titanium and a material composed of greater than 50% titanium, and wherein said second layer is made of one member selected from the group consisting of aluminum and a material composed of greater than 50% aluminum.

7. A method according to claim 2, wherein said semiconductor device is an infrared sensor having a light-receiving portion constituted by a plurality of pixels that are arranged in a matrix, and wherein said [the] regular patterns are bolometers respectively formed for said pixels.

8. A method according to claim 1, wherein said first and third peripheral portions are shaped to form a contiguous border around said active portion.

9. A method according to claim 1, wherein said first and third peripheral portions are each shaped to comprise a plurality trapezoids having edges that completely border all active portion edges.

* * * * *